United States Patent
Lee et al.

(10) Patent No.: US 9,425,434 B2
(45) Date of Patent: Aug. 23, 2016

(54) DISPLAY DEVICE

(71) Applicant: SAMSUNG DISPLAY CO., LTD., Yongin, Gyeonggi-Do (KR)

(72) Inventors: Jae-Yong Lee, Yongin (KR); Won-Kyu Kwak, Yongin (KR); Yang-Wan Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/547,610

(22) Filed: Nov. 19, 2014

(65) Prior Publication Data
US 2015/0380474 A1    Dec. 31, 2015

(30) Foreign Application Priority Data
Jun. 25, 2014    (KR) .................. 10-2014-0078378

(51) Int. Cl.
*H01L 51/52*    (2006.01)
*H01L 27/32*    (2006.01)

(52) U.S. Cl.
CPC ....... *H01L 51/5284* (2013.01); *H01L 51/5262* (2013.01); *H01L 27/3244* (2013.01)

(58) Field of Classification Search
CPC .................................................. H01L 27/3272
See application file for complete search history.

(56) References Cited

U.S. PATENT DOCUMENTS

| | | | |
|---|---|---|---|
| 8,717,258 B2 | 5/2014 | Kim et al. | |
| 2008/0007684 A1* | 1/2008 | Kim | 349/143 |
| 2010/0110326 A1* | 5/2010 | Isobe | 349/58 |
| 2010/0232162 A1* | 9/2010 | Shin et al. | 362/293 |
| 2011/0051055 A1* | 3/2011 | Lee et al. | 349/106 |
| 2011/0057861 A1* | 3/2011 | Cok et al. | 345/1.3 |
| 2011/0303930 A1* | 12/2011 | Bang et al. | 257/91 |
| 2013/0077004 A1* | 3/2013 | Yoso et al. | 349/39 |
| 2013/0119387 A1* | 5/2013 | Park et al. | 257/59 |
| 2013/0285938 A1 | 10/2013 | Kang et al. | |
| 2013/0299790 A1 | 11/2013 | Kang et al. | |
| 2013/0306939 A1 | 11/2013 | Park et al. | |
| 2014/0183471 A1* | 7/2014 | Heo | 257/40 |
| 2014/0300835 A1* | 10/2014 | Chu et al. | 349/12 |
| 2015/0115229 A1 | 4/2015 | Jung | |
| 2015/0132520 A1* | 5/2015 | Han et al. | 428/38 |

FOREIGN PATENT DOCUMENTS

| | | |
|---|---|---|
| KR | 10-2005-0051300 | 6/2005 |
| KR | 10-2013-0120721 | 11/2013 |
| KR | 10-2013-0125294 | 11/2013 |
| KR | 10-2013-0128940 | 11/2013 |
| KR | 10-2015-0047936 | 5/2015 |

* cited by examiner

*Primary Examiner* — Mohammad Islam
*Assistant Examiner* — Ankush Singal
(74) *Attorney, Agent, or Firm* — Lee & Morse, P.C.

(57) ABSTRACT

A display device includes a display panel having an encapsulation substrate over a display substrate, at least one film on the display panel, a black matrix on the at least one functional film, and a viewing angle controller on the display panel and overlapping at least the black matrix.

18 Claims, 5 Drawing Sheets

DISPLAY DEVICE

CROSS-REFERENCE TO RELATED APPLICATION

Korean Patent Application No. 10-2014-0078378, filed on Jun. 25, 2014, and entitled, "Display Device," is incorporated by reference herein in its entirety.

BACKGROUND

1. Field

One or more embodiments of the present invention relate to a display device.

2. Description of the Related Art

Organic light-emitting displays have been used in a variety of mobile devices, including smart phones, tablets, laptop computers, digital cameras, camcorders, portable information terminals, televisions, and other products. In addition to their thin profile and low power consumption, displays of this type may be made to be flexible. As a result, studies are being conducted to manufacture slimmer devices from organic light-emitting displays.

SUMMARY

In accordance with one embodiment, a display device includes a display panel including an encapsulation substrate over a display substrate; at least one film on the display panel; a black matrix on the at least one functional film; and a viewing angle controller on the display panel and overlapping at least the black matrix.

The display panel may include an active area to display light of an image, a circuit area outside the active area, and a sealing area outside the circuit area, and the viewing angle controller may be in at least part of the sealing area.

The viewing angle controller may extend from the sealing area to inside the display panel and is subject to being viewed outside of the display device. The black matrix may extend from one area of the at least one functional film that corresponds to the sealing area to an edge of the at least one functional film. The display may include at least one transistor having a semiconductor active layer, at least one gate electrode, a source electrode, and a drain electrode, and the viewing angle controller may include a same material and may be on a same layer as the at least one gate electrode.

The viewing angle controller may be covered by an insulating layer, and the encapsulation substrate may be on the insulating layer. The at least one gate electrode may include a plurality of gate electrodes on different layers with at least one insulating layer, and the viewing angle controller may include a same material and may be on a same layer as one of the gate electrodes.

A power supply wire may be electrically connected to the display panel and disposed in the circuit area, and the viewing angle controller may be on a different layer from the power supply wire and may be electrically connected to the power supply wire through a via hole. The power supply wire may include a same material and is on a same layer as the source or drain electrode.

A power supply wire may be electrically connected to the display panel and may be in the circuit area, and the viewing angle controller may be on a different layer from the power supply wire and may be not connected to the power supply wire. The power supply wire may include a same material and may be on a same layer as the source or drain electrode.

The viewing angle controller may include a conductive material. The at least one functional film may include at least one of a touch screen, a polarizing plate, or a cover window, and the at least one functional film may be an outermost film at an area of the black matrix. The display panel may be flexible or rigid.

The encapsulation substrate may be on the display substrate and may include at least one organic film and at least one inorganic film. The display may include at least one transistor on the display substrate; and an organic light-emitting device electrically connected to the at least one transistor.

In accordance with another embodiment, a display panel includes a film, a black matrix over the film, and a layer overlapping the black matrix, wherein the layer is in an area adjacent a circuit area, and wherein the layer is at a position to block a viewing distance area overlapping the black matrix. The layer may include a conductive material, and the area may be a sealing area.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
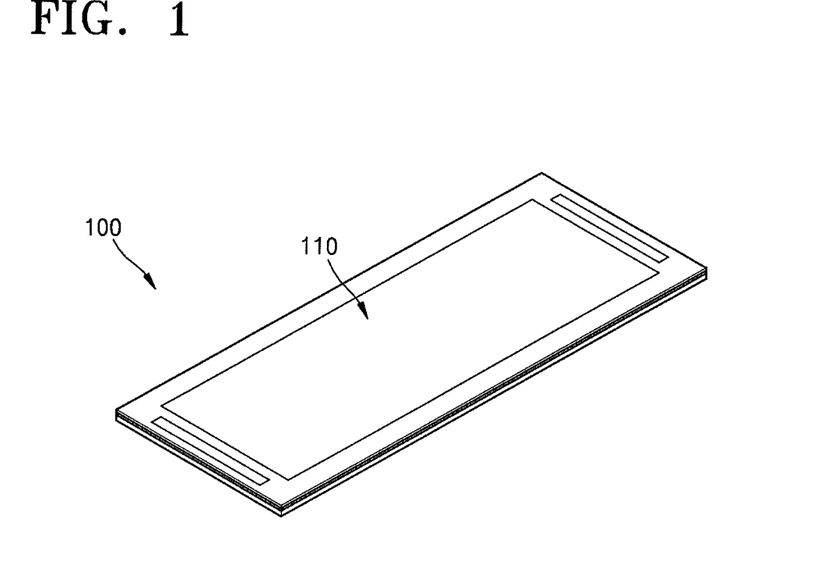
FIG. 1 illustrates a flexible display device in an opened state.
Figure 2:
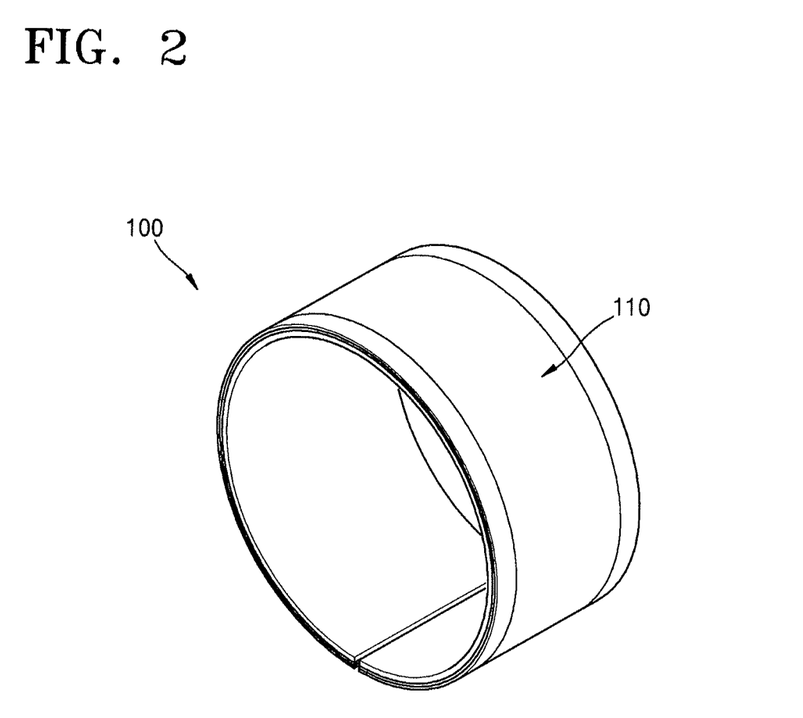
FIG. 2 illustrates the flexible display device in a curved state.

FIG. 1 illustrates a flexible display device 100 in an opened state, and FIG. 2 illustrates the display device 100 in a curved state. The flexible display device 100 may be an organic light-emitting display (OLED) device. In other embodiments, the display device 100 may be a display device that generates an image upon receiving power, such as a liquid crystal display, a field emission display, or an electronic paper display.

Referring to FIGS. 1 and 2, the display device 100 includes a flexible display panel 110 having a display unit to display an image. In operation, a user may view the image on the display panel 110 in any state, for example, in an opened state, a curved state, a twisted state, or another state based on the orientation of the display panel 110. A functional film having one or more predetermined functions may be disposed on the display panel 110. The functional film may be, for example, a polarizing plate, a touch screen, or a cover window.

Figure 3:
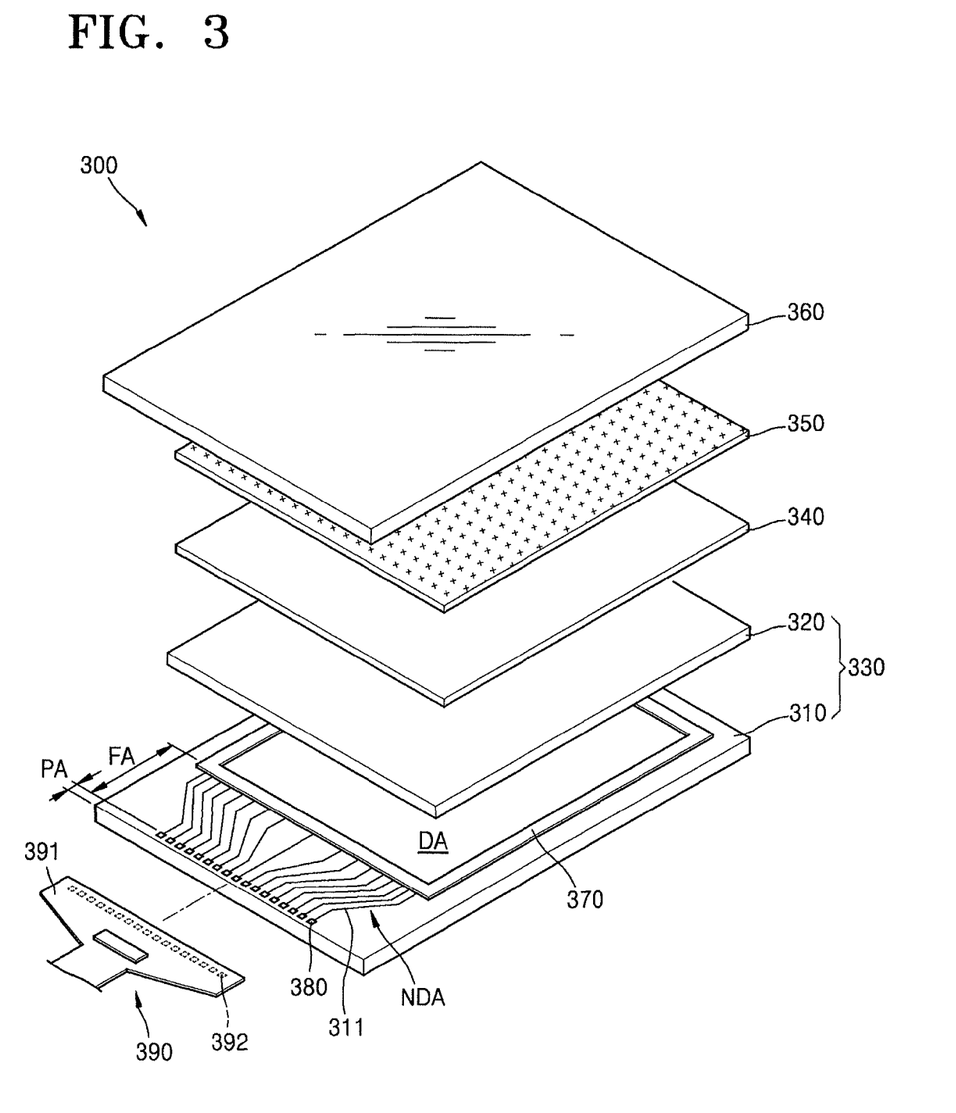
FIG. 3 illustrates another display device.

FIG. 3 illustrates an example of another display device 300 which is a rigid display device. Referring to FIG. 3, the display device 300 includes a display panel 330 including an encapsulation substrate 320 on a display substrate 310. The display panel 330 may have a display area DA which includes a display unit to display an image, and a non-display area NDA which extends adjacent to and/or outside the display area DA.

The display substrate 310 is a rigid substrate, e.g., a glass substrate, a polymer substrate, a metal substrate, or a combination thereof.

The encapsulation substrate 320 may include glass or polymer resin. The encapsulation substrate 320 may include, for example, at least one organic film and at least one inorganic film stacked on each other.

A sealing unit 370 is between the display substrate 310 and the encapsulation substrate 320, in order to seal the display area DA. The sealing unit 370 may be formed along edges of the display substrate 310 and the encapsulation substrate 320. The sealing unit 370 is formed along a circumference of the display area DA. The sealing unit 370 may include, for example, glass frit.

The non-display area NDA includes a fan-out area FA where a plurality of wires 311 are disposed, and a pad area PA where a plurality of pads 380 are disposed. The fan-out area FA is an area between the display area DA and the pad area PA. The fan-out area FA provides a path electrically connected to the pad 380 of the pad area PA, for example, using a line extracted from the display area DA, e.g., the wire 311 such as a gate line or a data line.

In the fan-out area FA, an interval between the wires 311 adjacent to the display area DA may be different from (e.g., wider than) an interval between the wires 311 adjacent to the pad area PA. Accordingly, the wires 311 may be diagonally arranged.

A functional film having one or more predetermined functions may be on the encapsulation substrate 320.

A touch screen 340 may be on the encapsulation substrate 320. The touch screen 340 may be, for example, an on-cell touch screen panel having a touch screen pattern. The touch screen 340 may be integrally formed on the encapsulation substrate 320, but this is not necessary.

A polarizing plate 350 may be formed on the touch screen 340. The polarizing plate 350 serves to prevent external light from reflecting from the display area DA. A cover window 360 for protecting the display panel 330, the touch screen 340, and the polarizing plate 350 may be disposed on the polarizing plate 350. The cover window 360 may include, for example, rigid glass.

A circuit board 390 for receiving an external signal may be connected to the pad 380. The circuit board 390 includes a flexible film 391 and a plurality of terminals 392. The terminals 392 are arranged at one edge of the flexible film 391, and are electrically and respectively connected to the pads 380. The circuit board 390 may be, for example, a flexible printed circuit board.

In the flexible display device 100 of FIG. 1 or the rigid display device 300 of FIG. 3, part of an edge of the display panel 110 or 330 may be externally visible.

Figure 4:
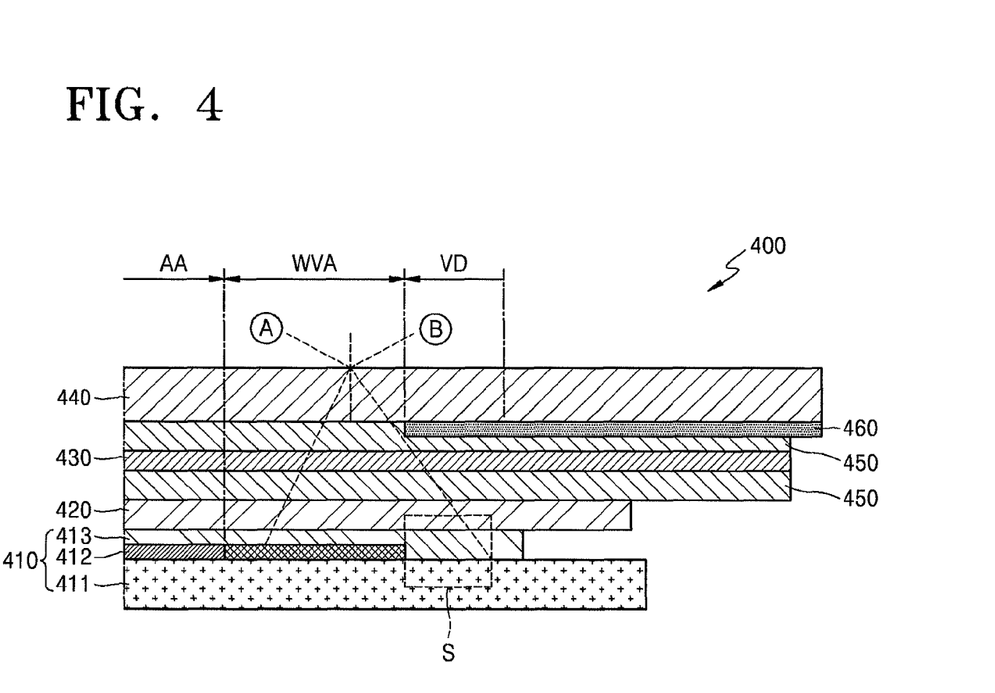
FIG. 4 illustrates another display device.

FIG. 4 illustrates a display device 400 which includes a display panel 410 having an encapsulation substrate 413 covering a display substrate 411. At least one thin-film transistor and a display device 412 electrically connected to the at least one TFT are on the display substrate 411.

One or more functional films having one or more predetermined functions is on the display panel 410. According to an embodiment, a polarizing plate 420 may be on the display panel 410. A touch screen 430 may be formed on the polarizing plate 420. A cover window 440 may be mounted on the touch screen 430. A black matrix 460 may be on one surface of the cover window 440, which faces the display panel 410.

An adhesive, such as an optical clear adhesive (OCA) 450, may be between the display panel 110 and the one or more functional films to adhere the display panel 110 and the one or more functional films.

The display device 400 may be divided into a plurality of areas. For example, the display device 400 may include an active area AA where an image is realized, a window viewing area WVA outside the active area AA and having a circuit pattern, and a viewing distance area VD.

The window viewing area WVA includes an area where a circuit pattern formed on the display substrate 411 is viewable, when the general display device 400 is viewed from an external point, for example, point B. The viewing distance area VD is an area where an edge S of the display panel 410, which is outside the window viewing area WVA, is viewable, when the general display device 400 is viewed from an external point, for example, point A. A range of the viewing distance area VD may be determined according to an external viewing angle.

When the viewing distance area VD is viewed from point A, the color of the display substrate 411 is recognized differently. For example, an edge of the display substrate 411 is externally shown because a circuit pattern of a conductive material is on the display panel 410 in the window viewing area WVA, whereas conductive material is not used in the viewing distance area VD. In order to prevent the edge of the display panel 410 from being externally visible, a viewing angle controller overlapping at least a part of the black matrix 460 may be formed in the viewing distance area VD.

Figure 5:
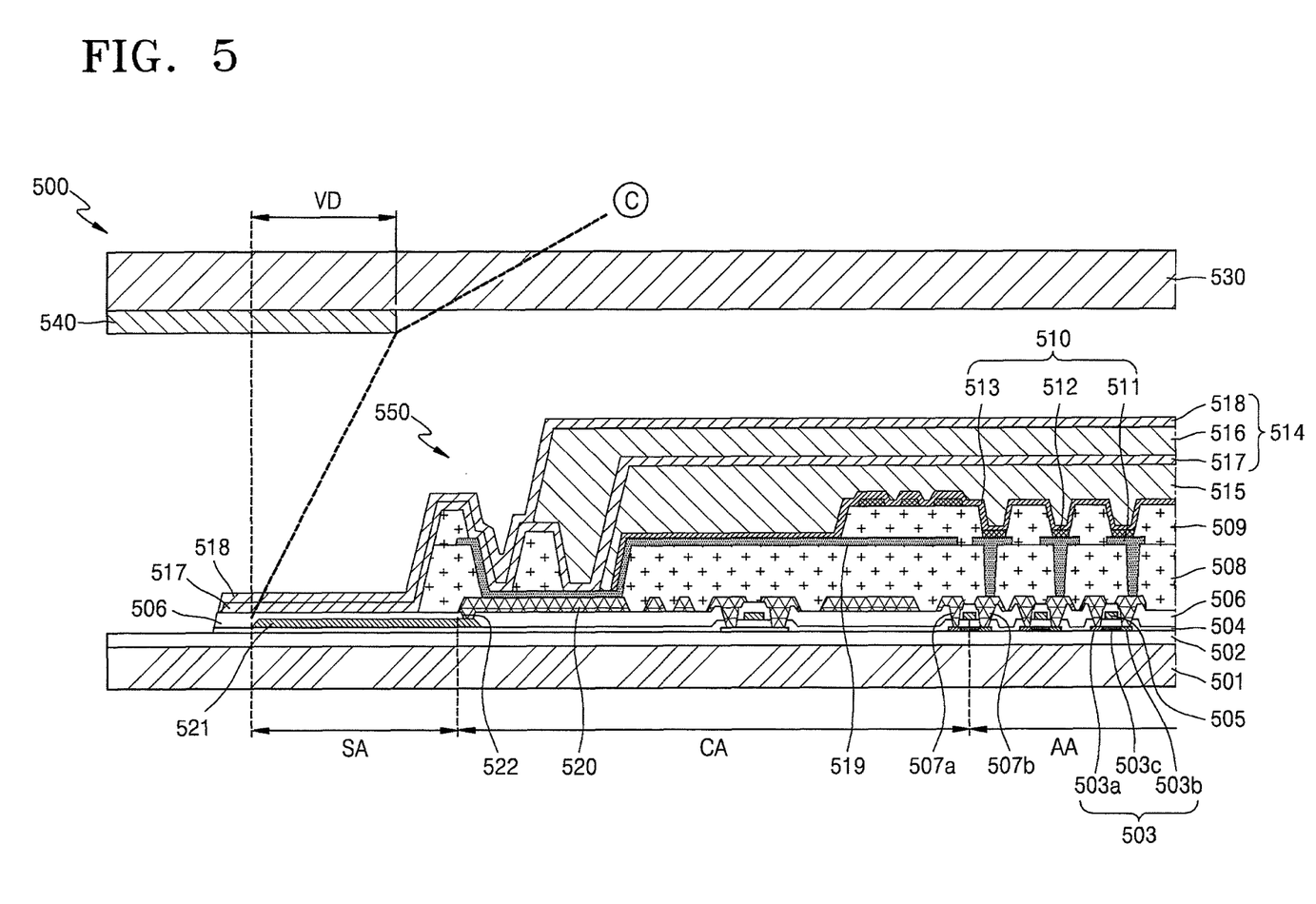
FIG. 5 illustrates an embodiment of a display device.

FIG. 5 illustrates an embodiment of a display device 500, which may be a flexible or rigid display device. Sub-pixels of the display device 500 may include at least one thin film transistor and an OLED.

Referring to FIG. 5, the display device 500 includes a display panel 550 having a display substrate 501 where a display unit to display an image is formed, and an encapsulation substrate 514 over the display substrate 501. The display panel 550 may have an active area AA in which an image is realized, a circuit area CA outside the active area AA, and a sealing area SA outside and adjacent to the circuit area CA.

The display substrate 501 may include a flexible insulating material or a rigid insulating material. For example, the display substrate 501 may be a flexible film, a rigid glass substrate, a polymer substrate, a metal substrate, or a combination thereof. The display substrate 501 may be transparent, semi-transparent, or opaque.

A barrier film 502 corresponding to a first insulating layer may be on the display substrate 501. In one embodiment, the barrier film 502 may entirely cover an upper surface of the display substrate 501. The barrier film 502 may include an inorganic film or an organic film.

For example, the barrier film 502 may include one or more inorganic materials such as silicon oxide (SiOx), silicon nitride (SiNx), silicon oxynitride (SiON), aluminum oxide (AlO), or aluminum nitride (AlN), and/or one or more organic materials such as acryl, polyimide, or polyester. The barrier film 502 may have a single layer or multilayer structure. The barrier film 502 serves to block oxygen and moisture, and flatten the top of the display substrate 501.

In the active area AA, a thin film transistor may be formed on the barrier film 502. In FIG. 5, the transistor is a top-gate-type, but may be a bottom-gate-type or another type is other embodiments.

A semiconductor active layer 503 may be on the barrier film 502. A source region 503a and a drain region 503b may be formed in the semiconductor active layer 503 by doping N-type or P-type impurity ions. A region between the source and drain regions 503a and 503b is a channel region 503c, where an impurity may not be doped.

The semiconductor active layer 503 may be include an inorganic semiconductor material or an organic semiconductor material, such as amorphous silicon or polysilicon. The semiconductor active layer 503 may include an oxide semiconductor, examples of which include oxides of Group 4, 12, 13, and 14 metal elements such as zinc (Zn), indium (In), gallium (Ga), tin (Sn), cadmium (Cd), germanium (Ge), and hafnium (Hf), or a combination thereof.

A gate insulating film 504 corresponds to a second insulating layer, which may be deposited on the semiconductor active layer 503. The gate insulating film 504 may include an inorganic film made of, for example, silicon oxide, silicon nitride, or metal oxide. The gate insulating film 504 may have a single layer or multilayer structure.

A gate electrode 505 may be formed in a certain region on the gate insulating film 504. The gate electrode 505 may be formed as a single layer including, for example, gold (Au), silver (Ag), copper (Cu), nickel (Ni), platinum (Pt), palladium (Pd), aluminum (Al), molybdenum (Mo), or chromium (Cr), a multilayer, or an alloy, such as Al:Nd or Mo:W.

An interlayer insulating film 506 corresponding to a third insulating layer may be on the gate electrode 505. The interlayer insulating film 506 may include, for example, an inorganic material such as silicon oxide or silicon nitride. In another embodiment, the interlayer insulating film 506 may include an organic material.

A source electrode 507a and a drain electrode 507b may be on the interlayer insulating film 506. For example, a contact hole may be formed by selectively removing the gate insulating film 504 and the interlayer insulating film 506. A source electrode 507a is electrically connected to the source region 503a through the contact hole. Also, the drain electrode 507b is electrically connected to the drain region 503b through the contact hole.

A protection film 508 (e.g., a passivation film and/or planarization film) corresponding to a fourth insulating layer may be on the source and drain electrodes 507a and 507b. The protection film 508 may serve to prevent moisture and oxygen from corroding the source and drain electrodes 507a and 507b.

Also, the protection film 508 protects and flattens layers below the protection film 508. The protection film 508 may have various configurations. For example, the protection film 508 may include an organic material such as acryl, or an inorganic material such as silicon nitride (SiNx). Also, the protection film 508 may have a single layer or multilayer structure.

An OLED 510 is formed on the thin film transistor and includes a first electrode 511, a second electrode 513, and an intermediate layer 512 between the first and second electrodes 511 and 513. The first electrode 511 is electrically connected to one of the source or drain electrodes 507a and 507b through the contact hole. The first electrode 511 corresponds to a pixel electrode.

The first electrode 511 operates as an anode, and may include one or more conductive materials. Also, the first electrode 511 may be a transparent or reflective electrode. When the first electrode 511 is a transparent electrode, the first electrode 511 may include, for example, indium tin oxide (ITO), indium zinc oxide (IZO), zinc oxide (ZnO), or indium oxide ($In_2O_3$). When the first electrode 511 is a reflective electrode, the first electrode 511 may be formed by forming a reflection film using Ag, Mg, Al, Pt, Pd, Au, Ni, Nd, Ir, Cr, or a compound thereof, and then forming ITO, IZO, ZnO, or $In_2O_3$ on the reflection film.

A pixel-defining layer (PDL) 509 may be on the protection film 508 to cover an edge of the first electrode 511 of the OLED 510. The PDL 509 surrounds the edge of the first electrode 511 to define an emission region of each sub-pixel. The PDL 509 may include an organic material (e.g., polyimide, polyamide, benzocyclobutene, acryl resin, or phenol resin) and/or an inorganic material, e.g., SiNx. The PDL 509 may have a single layer or a multilayer structure.

The intermediate layer may be on a region of the first electrode 511, which is exposed by etching part of the PDL 509. The intermediate layer 512 may be formed, for example, via a deposition process.

The intermediate layer 512 may include an organic emissive layer. In one embodiment, the intermediate layer 512 may include and organic emissive layer and also at least one of a hole injection layer (HIL), a hole transport layer (HTL), an electron transport layer (ETL), or an electron injection layer (EIL). In one embodiment, the intermediate layer 512 may include an organic emissive layer and also one or more functional layers, e.g., ones that perform predetermined functions.

The second electrode 513 may be on the intermediate layer 512. The second electrode 513 corresponds to a common electrode. Like the first electrode 511, the second electrode 513 may be a transparent or reflective electrode. The first electrode 511 may have a shape which corresponds, for example, to an opening of each sub-pixel. In another embodiment, the second electrode 513 may be formed on an entire surface of the display substrate 501. In one embodiment, the second electrode 513 may have a certain pattern. Also, locations of the first and second electrodes 511 and 513 may be switched in alternative embodiment.

The first and second electrodes 511 and 513 are insulated from each other by the intermediate layer 512. When a voltage is applied to the first and second electrodes 511 and 513, visible light is emitted from the intermediate layer 512 to generate an image recognizable by a user.

The encapsulation substrate 514 may be on the OLED 510 to protect the intermediate layer 512, or other layers, from external moisture or oxygen. The encapsulation substrate 514 may have a structure which includes at least one organic film and at least one inorganic film stacked on each other.

For example, the encapsulation substrate 514 may have a structure which includes at least one organic film (e.g., organic films 515 and/or 516) which includes epoxy, polyimide, polyethylene terephthalate, polycarbonate, polyethylene, or polyacrylate, and at least one inorganic film (e.g., inorganic films 517 and/or 518) which includes silicon oxide ($SiO_2$), silicon nitride (SiNx), aluminum oxide ($Al_2O_3$), titanium oxide (TiO$_2$), zirconium oxide (ZrOx), or zinc oxide (ZnO), alternately stacked on each other.

In one embodiment, the organic films 515 and 516 of the encapsulation substrate 514 may have a structure of at least one layer, and the inorganic films 517 and 518 may have a structure of at least two layers. An uppermost layer of the encapsulation substrate 514 may be an inorganic film, for example, the inorganic film 518, so as to prevent moisture from penetrating into the OLED 510.

A thin layer (e.g., a capping layer or a halogenated metal layer) including lithium fluoride (LiF), for protecting the OLED 510, may be formed between the second electrode 513 and the encapsulation substrate 514. At least one functional film for performing one or more predetermined functions may be formed on the display panel 550. Examples of a functional film include a polarizing plate, a touch screen, and a cover window.

In one embodiment, a cover window 530 may be mounted on the display panel 550. The cover window 530 serves to protect the display panel 550. The cover window 530 may be flexible or rigid based on the type of the display device 500. The cover window 530 may include, for example, a transparent material to allow an image displayed on the display panel 550 to be viewable.

A black matrix 540 may be on the cover window 530. The black matrix 540 is formed on one surface of the cover window 530, which faces the display panel 550. When a plurality of functional films are formed on the display panel 550, the black matrix 540 may be an outermost functional film, but this is not necessary. The black matrix 540 may extend from an area of the cover window 530, which corresponds to the sealing area SA, to an edge of the cover window 530, in a vertical direction of FIG. 5.

A viewing angle controller 521 overlapping at least a part of the black matrix 540 may be on the display substrate 501. The viewing angle controller 521 is a thin layer which includes, for example, a conductive material. When a user looks at the display device 500, the viewing angle controller 521 may cover the viewing distance area VD that is unnecessarily externally viewed.

The viewing angle controller 521 may be in the sealing area SA. The sealing area SA has a contact area where the inorganic films 517 and 518 of the encapsulation substrate 514 and the interlayer insulating film 506 contact each other. In order to increase sealing reliability, the contact area may be increased.

The viewing angle controller 521 includes an area from one edge of the sealing area SA to the inside of the display panel 550, which is viewable from outside the display device 500, for example, from point C. The viewing angle controller 521 may overlap at least part of the black matrix 540 in the vertical direction of FIG. 5.

The viewing angle controller 521 may be formed on the same layer as the gate electrode 550 that is formed on the active area AA. For example, the viewing angle controller 521 may be on the gate insulating film 504. The viewing angle controller 521 may include the same material as the gate electrode 505 and may be formed simultaneously with the gate electrode 505, but this is not a necessity.

The interlayer insulating film 506 covers the viewing angle controller 521. The inorganic films 517 and 518 of the encapsulation substrate 514 are stacked on the interlayer insulating film 506.

In the sealing area SA, the gate insulating film 504, the viewing angle controller 521, the interlayer insulating film 506, and the inorganic films 517 and 518 of the encapsulation substrate 504 may be sequentially stacked in the stated order on the display substrate 501.

A power supply wire 520 electrically connected to the thin film transistor in the active area AA may be mounted on the circuit area CA. The power supply wire 520 may be electrically connected to a circuit wire 519, which may be formed simultaneously with the first electrode 511.

The power supply wire 520 may be on the same layer as the source or drain electrode 507a or 507b, which are formed in the active area AA. The power supply wire 520 may be formed on the interlayer insulating film 506. The power supply wire 520 may be formed simultaneously with the source and/or drain electrode 507a or 507b. The power supply wire 520 may include, for example, the same material as the source or drain electrode 507a or 507b.

The power supply wire 520 may be on the interlayer insulating film 506. The viewing angle controller 521 may be on the gate insulating film 504, which may be an insulating layer different from that on which the power supply wire 520 is disposed.

The power supply wire 520 may not extend in the sealing area SA. For example, if the power supply wire 520 extends in the sealing area SA, the inorganic films 517 and 518 of the encapsulation substrate 514 are on the power supply wire 520. Accordingly, when the power supply wire 520 and the inorganic films 517 and 518 of the encapsulation substrate 514 contact each other, the power supply wire 520 formed of a metal material and the inorganic films 517 and 518 of the encapsulation substrate 514 formed of an insulating material poorly contact each other.

Accordingly, in the sealing area SA, the viewing angle controller 521 may be disposed on another layer with respect to the power supply wire 520, and, for example, may be below the inorganic films 517 and 518 of the encapsulation substrate 514 across the inter layer insulating film 506.

Because the inorganic films 517 and 518, which are insulating films, and the interlayer insulting film 506, which is also an insulating film, directly contact each other, adhesive strength may be increased. Also, a pattern of a metal material may be formed in the sealing area SA by the viewing angle controller 521.

The viewing angle controller 521 may be electrically connected to the power supply wire 520 through a via hole 522. Power is supplied to the viewing angle controller 521 to reduce static electricity generated while driving the display device 500.

In one embodiment, the viewing angle controller 521 may be on a different layer from the power supply wire 520 by an insulating layer, and may not be electrically connected to the power supply wire 520. In this case, the viewing angle controller 521 may be designed such that static electricity generated the display device 500 is driven is externally discharged. As such, the power supply wire 520 is formed in the circuit area CA, the viewing angle controller 521 having a metal pattern is formed in the sealing area SA corresponding to the viewing distance area VD, and the power supply wire 520 is not disposed on and below the viewing angle controller 521.

In one embodiment, when multiple gate electrodes in a display unit are on different layers using an insulating layer, the viewing angle controller 521 may include the same material and may be on the same layer as one of the gate electrodes.

In FIG. 5, the gate electrode 505 may be formed only on the gate insulating film 504. In another embodiment, a plurality of the gate electrodes 505 may be on different insulating layers.

Figure 6:
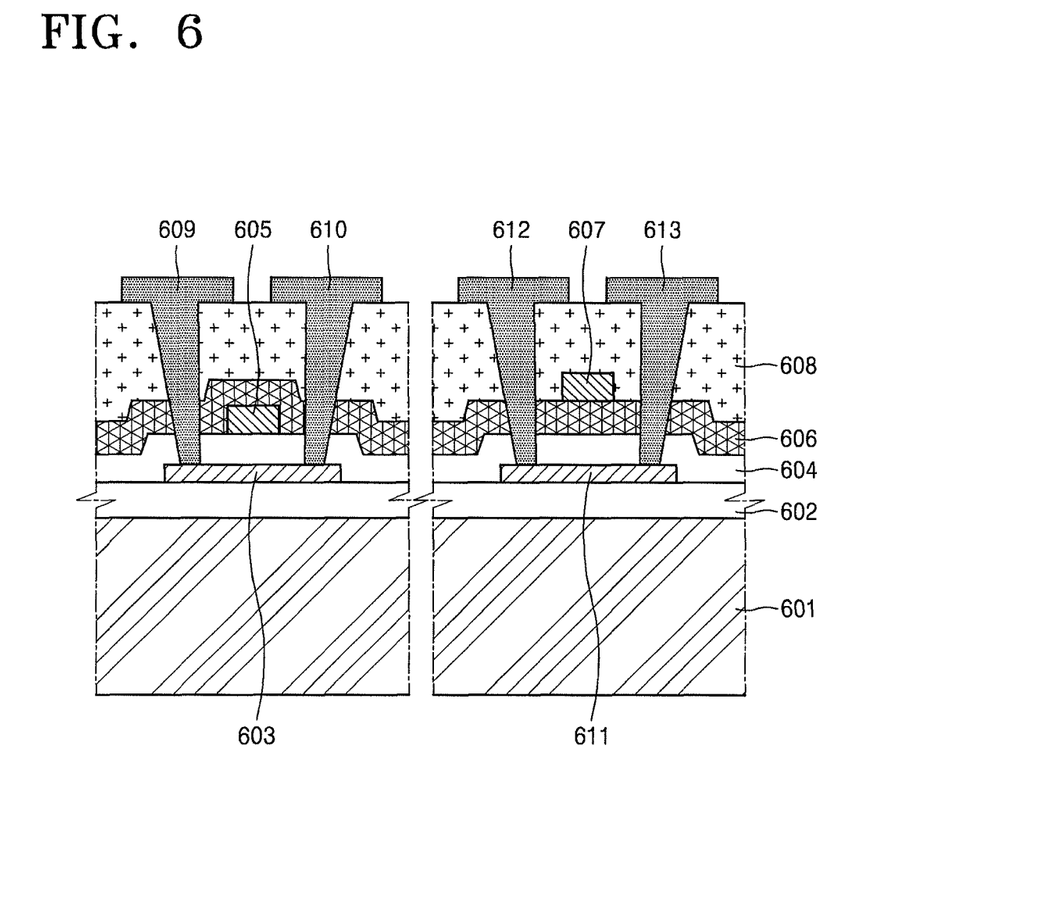
FIG. 6 illustrates an embodiment of a plurality of gate electrodes on a substrate.

Referring to FIG. 6, a barrier film 602 may be on a display substrate 601. A first semiconductor active layer 603 and a second semiconductor active layer 611 may be on the barrier film 602. A first gate insulating film 604 may be on the first and second semiconductor active layers 603 and 611.

A first gate electrode 605 may be on the first gate insulating film 604. A second gate insulating film 606 covers the first gate electrode 605. A second gate electrode 607 may be on the second gate insulating film 606. An interlayer insulating film 608 covers the second gate electrode 607.

The first semiconductor active layer 603 is electrically connected to a first source electrode 609 and a first drain electrode 610. The second semiconductor active layer 611 is electrically connected to a second source electrode 612 and a second drain electrode 613.

As described above, the first gate insulating film 604 having a one-layer structure may be formed between the first semiconductor active layer 603 and the first gate electrode 605. On the other hand, the first and second gate insulating films 604 and 606 having a two-layer structure may be formed between the second semiconductor active layer 611 and the second gate electrode 607.

As the thicknesses of the first and second gate insulating films 604 and 606 increase, the driving ranges of gate voltages applied to the first and second gate electrodes 605 and 607 may be increased. A wide driving range of a driving thin film transistor may cause light emitted from an OLED to have a wide gradation.

Also, because the first and second gate electrodes 605 and 607 are on different layers, interference may be reduced or may not occur. This may allow more devices to be disposed on the same area.

In one embodiment, two gate electrodes (e.g., the first and second gate electrodes 605 and 607) may be used. In other embodiments, three or more gate electrodes may be used. A plurality of gate electrodes may be electrically connected to a capacitor electrode, a scan line, or a light emission control line based on specification of a display device.

When the first and second gate electrodes 605 and 607 are on different insulating layers (e.g., respectively on the first and second gate insulating films 604 and 606), the viewing angle controller 521 in FIG. in the sealing area SA may include, for example, the same material and may be the same layer as any one of the first and second gate electrodes 605 and 607.

Referring back to FIG. 5, in the display device 500, because the viewing angle controller 521 is in the sealing area SA corresponding to the viewing distance area VD, when the display device 500 is viewed outside the display device 500, the color of the sealing area SA may be recognized to be the same color as the circuit area CA.

For example, because the power supply wire 520 formed of a conductive material is on the display substrate 501 in the circuit area CA, and the viewing angle controller 521 formed of a conductive material is in the sealing area SA, a metal film exists in both the circuit area CA and the sealing area SA. Thus, the circuit area CA and the sealing area SA may be recognized to be the same color.

By way of summation and review, when a display is viewed from certain points or angles, the color of from a display substrate may be perceived differently. This may result, for example, from the existence or absence of conductive materials in different regions or layers of the device. In accordance with one or more of the aforementioned embodiments, a display device is provided in which an edge of a display panel may not be viewed from outside the display device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display device, comprising:
a display panel including an encapsulation over a display substrate;
at least one film on the display panel;
a black matrix on the at least one film; and
a viewing angle controller on the display panel and overlapping at least the black matrix, wherein:
the display panel includes an active area to display light of an image, a circuit area outside the active area, a sealing area outside the circuit area, and at least one transistor having a semiconductor active layer, at least one gate electrode, a source electrode, and a drain electrode, and
the viewing angle controller is in at least part of the sealing area and includes a same material and is on a same layer as the at least one gate electrode.

2. The device as claimed in claim 1, wherein the viewing angle controller extends from the sealing area to inside the display panel and is subject to being viewed outside of the display device.

3. The device as claimed in claim 2, wherein the black matrix extends from one area of the at least one film that corresponds to the sealing area to an edge of the at least one film.

4. The device as claimed in claim 1, wherein:
the viewing angle controller is covered by an insulating layer, and
the encapsulation substrate is on the insulating layer.

5. The device as claimed in claim 1, wherein:
the at least one gate electrode includes a plurality of gate electrodes on different layers with at least one insulating layer, and
the viewing angle controller includes a same material and is on a same layer as one of the gate electrodes.

6. The device as claimed in claim 1, wherein:
a power supply wire electrically connected to the display panel and disposed in the circuit area, and
the viewing angle controller is on a different layer from the power supply wire and is electrically connected to the power supply wire through a via hole.

7. The device as claimed in claim 6, wherein the power supply wire includes a same material and is on a same layer as the source or drain electrode.

8. The device as claimed in claim 1, wherein:
a power supply wire is electrically connected to the display panel and is in the circuit area, and
the viewing angle controller is on a different layer from the power supply wire and is not connected to the power supply wire.

9. The device as claimed in claim 8, wherein the power supply wire includes a same material and is on a same layer as the source or drain electrode.

10. The device as claimed in claim 1, wherein the viewing angle controller includes a conductive material.

11. The device as claimed in claim 1, wherein:
the at least one film includes at least one of a touch screen, a polarizing plate, or a cover window, and
the at least one film is an outermost film at an area of the black matrix.

12. The device as claimed in claim 1, wherein the display panel is flexible.

13. The device as claimed in claim 1, wherein the display panel is rigid.

14. The device as claimed in claim 1, wherein the encapsulation substrate is on the display substrate and includes at least one organic film and at least one inorganic film.

15. The device as claimed in claim 1, wherein the display includes:
at least one transistor on the display substrate; and
an organic light-emitting device electrically connected to the at least one transistor.

16. A display panel, comprising:
a film;
a black matrix over the film; and
a layer overlapping the black matrix,
wherein the layer is in an area adjacent a circuit area, wherein the layer is at a position to block a viewing distance area overlapping the black matrix, wherein the display panel includes an active area to display light of an image, a circuit area outside the active area, a sealing area outside the circuit area, and at least one transistor having a semiconductor active layer, at least one gate electrode, a source electrode, and a drain electrode, and wherein the viewing angle controller is in at least part of the sealing area and includes a same material and is on a same layer as the at least one gate electrode.

17. The panel as claimed in claim 16, wherein the layer includes a conductive material.

18. The panel as claimed in claim 16, wherein the area is a sealing area.

* * * * *